United States Patent
Wendel

(10) Patent No.: US 11,569,107 B2
(45) Date of Patent: Jan. 31, 2023

(54) METHOD FOR INSPECTING A CONTAINER AND INSPECTION SYSTEM

(71) Applicant: BROOKS AUTOMATION (GERMANY) GMBH, Radolfzell (DE)

(72) Inventor: Alexander Wendel, Dürrheim-Unterbaidingen (DE)

(73) Assignee: Brooks Automation (Germany) GmbH

( * ) Notice: Subject to any disclaimer, the term of this patent is extended or adjusted under 35 U.S.C. 154(b) by 176 days.

(21) Appl. No.: 16/619,713

(22) PCT Filed: Jun. 7, 2018

(86) PCT No.: PCT/EP2018/064993
§ 371 (c)(1),
(2) Date: Dec. 5, 2019

(87) PCT Pub. No.: WO2018/224587
PCT Pub. Date: Dec. 13, 2018

(65) Prior Publication Data
US 2020/0203201 A1    Jun. 25, 2020

(30) Foreign Application Priority Data
Jun. 8, 2017 (EP) .................... 17175062

(51) Int. Cl.
*H01L 21/67* (2006.01)
*H01L 21/673* (2006.01)
(Continued)

(52) U.S. Cl.
CPC ... *H01L 21/67288* (2013.01); *G01N 21/8851* (2013.01); *G01N 21/90* (2013.01);
(Continued)

(58) Field of Classification Search
CPC ............. G06T 7/40; G06T 7/0004; G06T 2207/10152; G06T 2207/30148;
(Continued)

(56) References Cited

U.S. PATENT DOCUMENTS 5,923,419 A * 7/1999 Thomas .............. G01N 21/909
356/239.4
9,810,641 B2    11/2017 Sood et al.
(Continued)

FOREIGN PATENT DOCUMENTS

| JP | 2004266221 | 9/2004 |
|---|---|---|
| TW | 561810 | 12/2016 |
| WO | 2016139249 | 9/2016 |

OTHER PUBLICATIONS

International Search Report dated Oct. 10, 2018; International Application No. PCT/EP2018/064993.

*Primary Examiner* — Sang H Nguyen
(74) *Attorney, Agent, or Firm* — Perman & Green, LLP; Colin C. Durham

(57) ABSTRACT

The present disclosure relates to a method for inspecting a container body adapted and configured to hold substrates, comprising the steps of directing light from a light source onto a reflector element positioned within an interior space of the container body, such that the light is reflected to illuminate at least one interior surface of the container body, wherein the light is reflected by the reflector element in a diffuse manner and generating at least one image of the at least one interior surface by means of at least one camera, and evaluating the state of the container body on the basis of the at least one image.

12 Claims, 2 Drawing Sheets

(51) Int. Cl.
*G06T 7/40* (2017.01)
*G06T 7/00* (2017.01)
*G01N 21/88* (2006.01)
*G01N 21/90* (2006.01)

(52) U.S. Cl.
CPC .............. *G06T 7/0004* (2013.01); *G06T 7/40* (2013.01); *H01L 21/67303* (2013.01); *G01N 2201/0636* (2013.01); *G06T 2207/10152* (2013.01); *G06T 2207/30148* (2013.01)

(58) Field of Classification Search
CPC ........ H01L 21/67288; H01L 21/67303; G01N 21/8851; G01N 21/90; G01N 2201/0636
See application file for complete search history.

(56) References Cited

U.S. PATENT DOCUMENTS

| | | | | |
|---|---|---|---|---|
| 2005/0225752 | A1* | 10/2005 | Takai | G01N 21/4795 356/237.1 |
| 2006/0102528 | A1* | 5/2006 | Bourely | B07C 5/342 209/576 |
| 2012/0118504 | A1 | 5/2012 | Nomura et al. | |

* cited by examiner

METHOD FOR INSPECTING A CONTAINER AND INSPECTION SYSTEM

CROSS-REFERENCE TO RELATED APPLICATIONS

This application is a National Stage of International Application No. PCT/EP2018/064993, having an International Filing date of 7 Jun. 2018, which designated the United States of America, and which International Application was published under PCT Article 21(2) as WO Publication No. 2018/224587 A1, which claims priority from and the benefit of European Patent Application No. 17175062.3 filed on 8 Jun. 2017, the disclosures of which are incorporated herein by reference in their entireties.

BACKGROUND

1. Field

The application relates to a method and an inspection system for determining a state of a substrate carrier or container.

2. Brief Description of Related Developments

Specialised carriers and containers (herein, "containers") for holding substrates (e.g., semiconductor wafers, reticles, flat panel displays, or other substrates used in the manufacture of electronic devices) typically comprise a body member, which defines an internal space, and a lid member, which can be sealably connected to the body, defining a closed and sealed state of the container, so that, for example, a controlled environment can be provided within the container. The lid member can be opened and/or disconnected from the body in order to load or unload the container. On at least two opposite interior surfaces, the body is typically provided with a number of parallel grooves or ridges adapted to stack a number of substrates securely and safely in the container, without them touching one another.

SUMMARY

While the present disclosure in the following refers explicitly to front opening unified pods (FOUPs) and corresponding bodies as a preferred example of such a specialised container or container body, the disclosure is applicable to any kind of substrate container. As a further example, front opening shipping boxes (FOSB) can be mentioned.

In semiconductor wafer processing, robotic mechanisms are constantly arranging, moving, transporting, organizing, and processing wafers and wafer containers, such as a front opening unified pod (FOUP). The FOUP maybe damaged in the process (e.g. scratch, break, deform, etc.), which may also lead to damage to wafers being stored or transported in such FOUPs. There exists a need to efficiently inspect the substrate containers such as FOUPs for this kind of damage and/or defects. Also, the dimensions of containers such as FOUPs are critical, and have to meet certain specifications. Using FOUPs which do not conform to such specifications can potentially also cause damage to wafers being stored therein, as a secure and play free storage can, for example, not be guaranteed. Substrate containers such as FOUPs are also liable to contamination, by which for example a wafer manufacturing process is rendered less effective.

Inspection systems for FOUPs are disclosed in WO 2016/139249 A1, the entire contents of which is incorporated by reference herein.

It is desirable to be able to easily identify containers that are damaged and/or do not meet said specifications and/or are contaminated, so that such containers can be effectively removed.

According to the present disclosure, there are suggested a method and an inspection system for determining a state of a substrate container comprising the features of the respective independent claims.

The method of the present disclosure allows an effective illumination of the interior of a container body. By utilising reflector elements positioned at a desired position within the interior of the container body, light from a light source can be effectively utilised to illuminate at least one interior surface or a region of an interior surface, especially textured interior surfaces or surface regions, e. g. comprising ridges or grooves for holding or stacking substrates. Using reflector elements positioned in the interior of the container body can minimise or even avoid the requirement of moving the light source in order to illuminate regions of interest. By providing such an effective illumination of the interior of a container body, usage of cameras to generate images of the at least one interior surface of the container can be optimised, so that, as a result, an evaluation of the state of the container body can be performed in an effective manner.

According to the present disclosure, the light from the light source is reflected by the reflector element in a diffuse manner. Such a diffuse reflection of light leads to an homogeneous illumination of interior surfaces of the container body, whereby especially the casting of shadows on textured surfaces, for example due to ridges or grooves, can be prevented. This significantly simplifies the generation of images of such surfaces.

In this connection, it is noted that the concept of evaluation of the state of a container body is meant to especially comprise an evaluation of damage to the container body, an evaluation of whether its dimensions conform to desired specifications, and an evaluation of potential contamination.

Preferred aspects of the present disclosure are the subject matter of the dependent claims.

According to a preferred aspect, light from the light source is reflected from at least two reflection surfaces of the reflector element which are provided at an angle to one another. Hereby, it is advantageously possible to simultaneously illuminate different interior surfaces of the container body, for example two opposite surfaces, especially two opposite surfaces provided with ridges or grooves for holding or stacking substrates.

According to a preferred aspect, the substrate container is a front opening unified pod (FOUP). In order to provide an effective handling of wafers during wafer processing, it is of the utmost importance that FOUPs are in immaculate condition in order to avoid any kind of mishandling or contamination of substrates.

Advantageously, the step of evaluating the state of the container body comprises image analysis of the at least one recorded image. According to a preferred aspect, the at least one image is generated by at least one line scan camera and/or at least one area scan camera. Line scan cameras provide advantageous handling in connection with wide fields of view. On the other hand, for certain applications, area scan cameras can provide a faster processing of images.

According to a preferred aspect of the inspection system, the reflector element comprises at least two reflection surfaces arranged at an angle to one another. Any expedient number of reflection surfaces, for example two, three or four, can be provided. For example, the reflector element can be provided with reflection surfaces arranged in the form of a pyramid, i.e. including four reflection surfaces.

According to a preferred aspect, the reflector element comprises two reflection surfaces forming a V-shape. With such a reflector element, light can be directed onto the two reflection surfaces to provide a homogeneous illumination of two opposite interior surfaces of a container, especially of opposite surfaces containing ridges or grooves for holding or stacking wafers or reticles.

Advantageously, the at least one camera is provided as a line scan camera or an area scan camera, as mentioned above.

Also it is advantageously possible to provide the two reflection surfaces such that the angle between them is variable. For example it is possible to provide neighbouring reflection surfaces with an articulate joint, so that the surfaces can be angularly moved relative to one another. This enables an optimal setting of the reflection surfaces relative to one another to be able to modify the diffuse light generated in a desired way. In other aspects, proximate reflection surfaces are not joined together but are instead held in a predetermined distance or relationship proximately to each other. In some instances, a first reflection surface can be independently moved relative to a second reflection surface. In all such aforementioned embodiments, moveable reflection surfaces may be moved using an automated mechanism or may be moved and set manually.

Advantageously, the reflector element comprises at least two reflection surfaces, which are moveable, especially independently movable, relative to one another.

In some aspects, a method of the present disclosure includes using movable reflection surfaces to modify sightlines to an imaging device and/or illumination of a container during imaging. For example, in a first step, movable reflection surfaces may be moved at least partially into a container and an image may be taken. Next, in a second step, the movable reflection surfaces may be moved further into the container, the movable reflection surfaces may be moved relative to one another, the number or brightness of lighting sources may be changed, or the location of an imaging device may be changed, and then another image is taken. This second step may be repeated any number of times to provide a sequence of images. Analysis of such a successive sequence of images can permit detailed examination of a container under various lighting and/or viewing angles.

According to a preferred aspect, the evaluating unit is configured to provide an image analysis of the at least one image generated by the at least one camera. Such an image analysis may comprise measurement of dimensions for example using reference marks provided on the container being inspected and/or in the optical system of the camera. An image analysis for example is adapted to detect irregularities on a surface. For example, under certain circumstances defects can be easily identified in the context of pattern recognition, as they will typically constitute only a small part of a surface as a whole, which constitutes an image background or a background pattern for the defects, and images of the defects differ significantly from such a pattern or background. This method can also be used to identify certain contaminants on surfaces, such as, for example, broken pieces of a wafer or of the container itself. Especially, by means of comparing images generated by the at least one camera with images of containers conforming to a desired specification, i.e. reference images, container bodies not conforming to these specifications can be safely identified.

Advantageously, at least two cameras are provided, at least one of which is adapted to provide a variable visual field. For example, a first camera can be provided which is adapted to provide a panoramic view of a complete interior surface a container body, together with a second camera for providing a variable visual field, which can be substantially smaller than that of the first camera. By means of such an arrangement, general features of a container can be detected at the same time as detailed features. A camera can be provided with a zoom-system in order to vary the size of its visual field.

Preferably, at least one camera is coupled to a positioning system. Such a coupling to a positioning system facilitates actual measurements of container dimensions or features on the basis of detection data.

Preferably, the at least one camera is provided to be coupled to a linear guide and/or to swiveling and/or pivoting device. By means of such coupling, a field of view of a camera can be expediently adjusted, for example to alternate between providing a general field of view, and a specific field of view, and also in order to perform scanning of an area of interest on a container surface.

Expediently, the camera is adapted to produce a digital image of an area of interest on the interior surface of a container, especially a FOUP, the evaluating unit of the inspection system further comprising a data processing unit adapted for processing generated digital images by means of an algorithm coupled to a memory and a processor of the data processing unit to determine the state of the container. In this connection, it is especially possible to determine damage to a FOUP body, for example a broken-off or damaged feature of a FOUP, such as a ridge or groove for holding a substrate (e.g., a wafer or a reticle), and also defects, such as distortions, for example due to exposure to heat or other outside influences.

Advantageously, the at least one camera, is adapted to scan an inspection window, wherein the inspection window is square-shaped, circular-shaped, triangular-shaped, oval-shaped or any combination thereof, the detection device being adapted to scan the inspection window continuously or intermittently.

In at least one aspect, the present disclosure discloses systems and methods for determining damages and/or defects to FOUPs by scanning a visual field using a camera. One or more cameras may be installed inside a visual inspection chamber of a wafer processing system, wherein the one or more FOUP(s) may be positioned. The camera may be configured to move along one or more linear guides. The movement of the camera may allow wider scanning of as well as a high resolution of images of a particular area of interest of the FOUP. The particular area of interest may be an inner or an outer surface of the FOUP. The scanning of the particular area of interest may produce a digital image of the particular area of interest. The produced image may be used by an algorithm coupled to a memory and a processor of a data processing unit to identify damages and/or defects.

BRIEF DESCRIPTION OF THE DRAWINGS

Preferred aspects will now be described referring to the accompanying figures. Herein.

DETAILED DESCRIPTION

Figure 1:
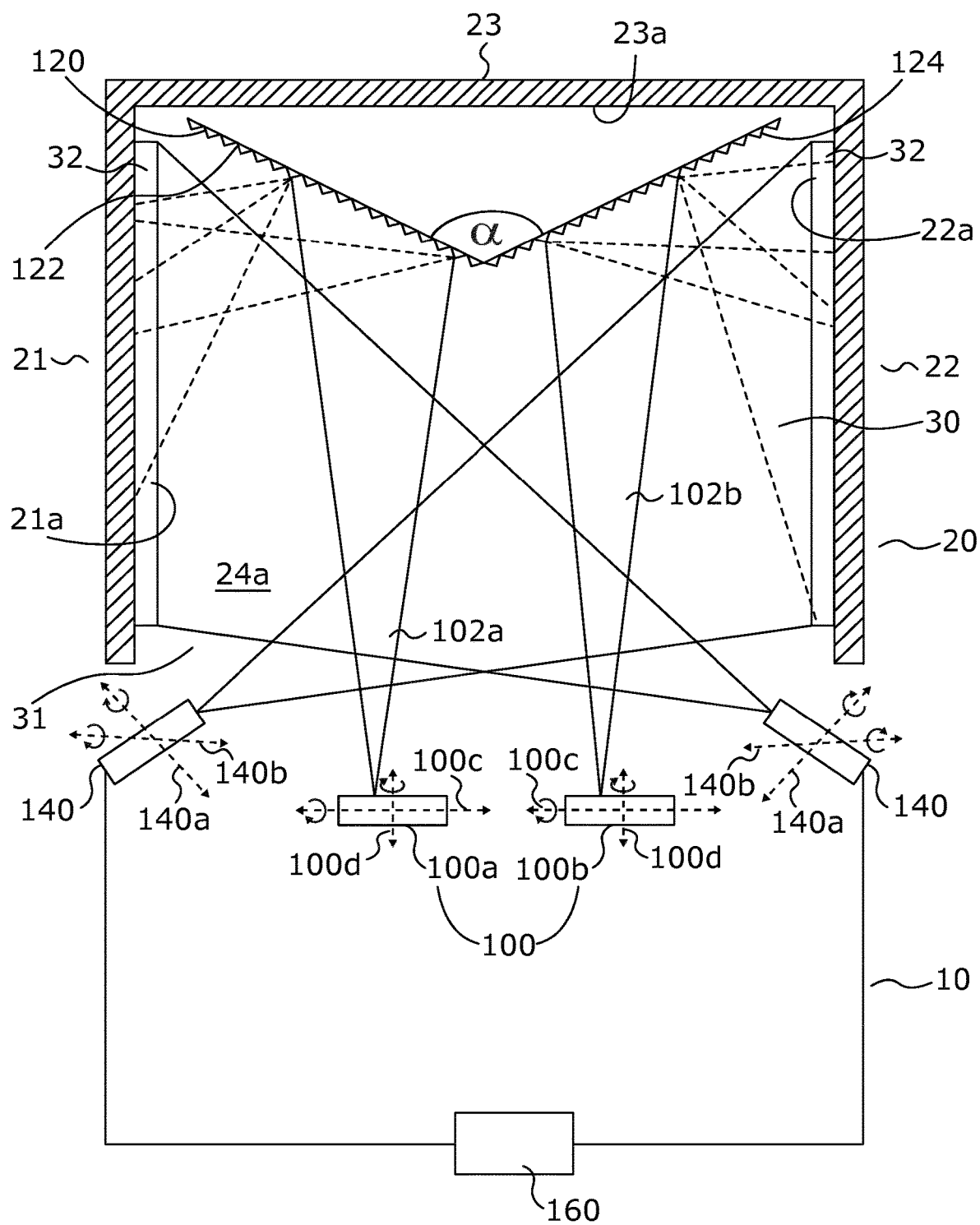
FIG. 1 shows a schematic top sectional view of an embodiment of the inspection system according to invention.

In FIG. 1, a sectional top view of a preferred aspect of an inspection system according to the disclosure is shown.

The inspection system, generally designated 10 is adapted to inspect a container body 20 of a container for holding substrates (e.g., wafers or reticles).

Container body 20 comprises five walls, i.e. two sidewalls 21, 22, a rear wall 23, a bottom wall 24 and a top wall (not shown in the sectional view of FIG. 1). Container body 20 defines an interior space 30 comprising an opening 31.

By means of a lid member (not shown in FIG. 1), the interior space 30 can be closed and sealed to provide a controlled environment within a substrate container thus provided by container body 20 and the (not shown) lid member.

The walls of container body 20 each define interior surfaces. The interior surfaces of the walls visible in FIG. 1 are designated 21a-24a.

The interior surfaces 21a, 22a of side walls 21, 22 are provided with a number of ridges 32 for holding or stacking substrates. Obviously, in the sectional perspective of FIG. 1, only one of these ridges is visible for each interior surface 21a, 22a.

Inspection system 10 comprises a light source 100, a reflector element 120 positioned within the interior space 30 of the container body 20, cameras 140 and an evaluating unit 160, provided for example as a computer. Cameras 140 and/or light sources 100 can be provided to be movable in a translational and/or pivotal manner. Guide systems defining translational and pivotal axes may be provided. Such axes are schematically shown and indicated with reference numerals 140 a, 140 b for cameras 140, and 100 c, 100 d for the light sources 100. Advantageously, cameras 140 and light sources 100 are mounted on separate guide systems.

Reflector element 120 comprises two reflection surfaces 122, 124 adapted to provide diffuse reflection of light impinging on it. For example, reflection surfaces 122, 124 are provided as diffusors including ground glass diffusors, teflon diffusors or opal glass diffusors.

Light source 100 comprises at least one light element (e.g., a spotlight element). In the embodiment shown in FIG. 1, two light elements 100a, 100b are provided. In some instances, at least two light elements are used and the light elements can be independently controlled to turn on, turn off, dim, or move individual light elements to change illumination patterns within the container.

Cameras 140 are provided as line scan cameras, by means of which high resolution images can be generated. Images generated by cameras 140 are passed onto evaluating unit 160 for processing, as will be further explained below.

Illuminating light 102a, 102b provided by spotlight members 100a, 100b is reflected from reflection surfaces 122, 124 of a reflector element 120 in a diffuse manner, as is schematically shown by dashed lines in FIG. 1. This leads to a homogenous illumination of at least two opposite interior surfaces 21a, 22a of side walls 21, 22. Any shading or shadows, which would occur due to bridges 32 in case of a non-diffuse illumination, can be avoided. Utilizing this homogenous illumination of interior surfaces 21a, 22a, cameras 140 generate images of interior surfaces 21a, 22a, and pass these onto evaluating unit 160.

The simultaneous illumination of two interior surfaces 21a, 22a opposing one another allows simultaneous generation of images of these surfaces by means of cameras 140. These simultaneously generated images can be simultaneously processed and evaluated by means of evaluating unit 160, resulting in a simultaneous inspection of both interior surfaces 21a, 22a of container body 20.

On the basis of the images generated by cameras 140, evaluating unit 160 evaluates the state of container body 20. For example, defects on interior surfaces 21a, 22a, especially on ridges 32, can be detected, using appropriate image recognition tools. Also, it is possible to effectively identify contaminations in this way. Also, for example by utilizing comparative reference images, dimensions and measurements of the container body, for example dimensions of the interior surfaces, especially ridges 32, as well as for example incorrectly mounted and/or missing parts can be identified.

In case rear interior surface 23a is to be inspected, it is possible to remove reflector element 120 from the interior space 30 of container body 20, and for example position a reflector element comprising only one diffusely reflecting surface in interior space 30. According to a further aspect, it is also possible to move reflection surfaces 122, 124 towards one another in an articulated manner, thereby reducing angle α. In case angle α is reduced for example to 0, i.e. the reflection surfaces essentially being arranged back-to-back, cameras 140 can generate sufficiently complete images of rear interior surface 23a.

According to yet another aspect, it is also possible to move reflection surfaces 122, 124 away from one another in an articulated manner, thereby increasing angle α. In some instances, the reflection surfaces 122 can be inserted into container such that angle α is small, for example, to provide for adequate clearance from container features, and then reflection surfaces 122 can be moved to increase angle α for appropriate illumination of the container surfaces. In some aspects, reflection surfaces 122, 124 can be independently moved relative to each other. Such independent motion need not be limited to changing an angle formed by adjacent surfaces. In some instances, reflection surfaces 122, 124 may be independently moveable relative to one another, for example, in an x and/or y and/or z direction of a Cartesian system.

Figure 2:
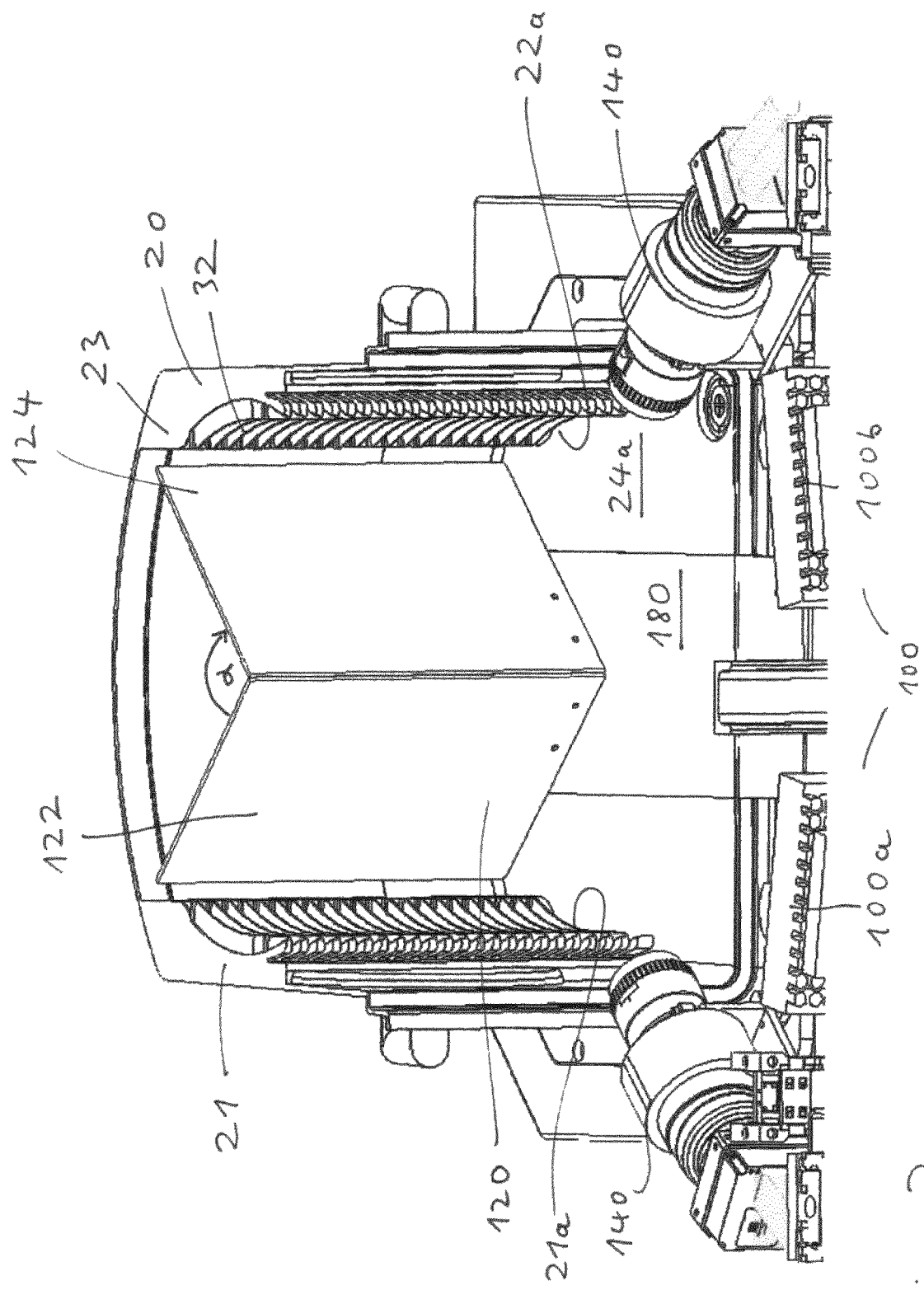
FIG. 2 shows a perspective view of a further embodiment of the inspection system according to the invention.

FIG. 2 shows a further aspect of an inspection system according to the invention specifically adapted to inspect a FOUP. For ease of reference, identical or equivalent components as already described in connection with FIG. 1 are provided with the same reference numerals.

As can be seen in FIG. 2, ridges 32 on interior surfaces 21a, 22a are slightly curved, in order to correspond to the shape of typical wafers. In this aspect, reflector element 120 is attached to a platform member 180. By actuating this platform member 180 it is especially easy to insert reflector element 120 into FOUP 20 or remove it therefrom. Alternatively, it is possible to arrange cameras 140 and spotlights 100a, 100b on a separate unit, so that these components can be moved simultaneously in an easy manner. Evaluating unit 160 is not shown in FIG. 2. In other aspects not shown, reflection surfaces 122, 124 may be independently attached to a platform member having more than one arm for supporting reflection surfaces 122, 124 independently. In other aspects, reflector element 120 may be placed within FOUP 20 so that it stands independently within the FOUP.

Be it noted that the inspection system and method, especially the at least one mirror, as described in European patent application EP 17 174 967.4 entitled "Inspection system and method of inspection for substrate containers", which was filed with the European Patent Office on the same date as the present application, the entire contents of which are hereby incorporated by reference, may be used in conjunction with the method and inspection system for inspecting a container body as described and/or claimed in the present application.

It should be understood that the foregoing description is only illustrative of the aspects of the disclosed embodiment Various alternatives and modifications can be devised by those skilled in the art without departing from the aspects of the disclosed aspect. Accordingly, the aspects of the disclosed aspect are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A method for inspecting a container body configured to hold substrates, the method comprising:
    directing light from a light source onto a reflector element positioned within an interior space of the container body, such that the light is reflected to homogenously illuminate at least one interior surface of the container body, wherein the light is reflected by the reflector element in a diffuse manner, so as to cause a homogeneous light image on the at least one interior surface;
    generating at least one image of the at least one interior surface with at least one camera, the at least one image being effected by light reflected off of the homogenously illuminated at least one interior surface; and
    evaluating the state of the container body on the basis of the at least one image.

2. The method according to claim 1, wherein the reflector element includes at least two reflection surfaces arranged at an angle to one another.

3. The method according to claim 1, wherein evaluating the state of the container body comprises image analysis of the at least one generated image.

4. The method according to claim 1, wherein the at least one image is generated by at least one line scan camera.

5. An inspection system for inspecting a container body configured to hold substrates, the inspection system comprising:
    a light source;
    a reflector element configured to be positioned within an interior space of the container body, wherein the reflector element comprises at least one reflection surface configured to provide diffuse reflection of light from the light source to homogenously illuminate at least one interior surface of the container, so as to cause a homogeneous light image on the at least one interior surface;
    at least one camera configured to generate at least one image of the at least one interior surface of the container body illuminated by light reflected from the reflector element, the at least one image being effected by light reflected off of the homogenously illuminated at least one interior surface; and
    an evaluating unit configured to evaluate the state of the container body on the basis of the at least one image.

6. The inspection system according to claim 5, wherein the reflector element comprises at least two reflection surfaces arranged at an angle to one another.

7. The inspection system according to claim 6, wherein the at least two reflection surfaces are provided such that the angle is variable.

8. The inspection system according to claim 5, wherein the reflector element comprises two reflection surfaces forming a V-shape.

9. The inspection system according to claim 5, wherein the at least one camera is provided as a line scan camera.

10. The inspection system according to claim 5, wherein the evaluating unit is configured to provide an image analysis of the at least one image generated by the at least one camera.

11. The inspection system according to claim 5, wherein the reflector element comprises at least two reflection surfaces which are moveable relative to one another.

12. The inspection system according to claim 11, wherein the at least two reflection surfaces are independently moveable relative to one another.

* * * * *